US00RE34771E

United States Patent [19]

Itou et al.

[11] E Patent Number: Re. 34,771

[45] Reissued Date of Patent: Nov. 1, 1994

[54] VOLTAGE FOLLOWER CIRCUIT HAVING IMPROVED DYNAMIC RANGE

[75] Inventors: Yuuzi Itou; Syuniti Tutida, both of Saitama, Japan

[73] Assignee: Kabushiki Kaisha Toshiba, Kawasaki, Japan

[21] Appl. No.: 965,693

[22] Filed: Oct. 23, 1992

Related U.S. Patent Documents

Reissue of:

[64] Patent No.: 5,068,552
Issued: Nov. 26, 1991
Appl. No.: 579,628
Filed: Sep. 10, 1990

[30] Foreign Application Priority Data

Sep. 11, 1989 [JP] Japan ..... 1-232939

[51] Int. Cl.[5] ..... H03K 5/22

[52] U.S. Cl. ..... 327/333; 327/482; 327/50

[58] Field of Search ..... 307/359, 362, 451, 454, 307/475, 494, 455, 254, 255

[56] References Cited

U.S. PATENT DOCUMENTS

| | | | |
|---|---|---|---|
| 4,593,211 | 6/1986 | Belforte | 307/455 |
| 4,609,837 | 9/1986 | Yagyuu et al. | 307/455 |
| 4,631,427 | 12/1986 | Mazumber et al. | 307/455 |
| 4,678,942 | 7/1987 | Kanai et al. | 307/455 |
| 4,725,979 | 2/1988 | Hoberman | 307/455 |
| 4,806,800 | 2/1989 | Khan | 307/455 |
| 4,864,166 | 9/1989 | Glocguen | 307/455 |
| 4,902,915 | 2/1990 | Tran | 307/475 |
| 4,972,103 | 11/1990 | Barbu | 307/359 |
| 4,980,582 | 12/1990 | Waller et al. | 307/475 |
| 4,996,448 | 2/1991 | Abdi | 307/339 |

FOREIGN PATENT DOCUMENTS

| | | | |
|---|---|---|---|
| 2207570 | 2/1989 | United Kingdom | 307/455 |

*Primary Examiner*—Timothy P. Callahan
*Assistant Examiner*—Terry D. Cunningham
*Attorney, Agent, or Firm*—Banner, Birch, McKie & Beckett

[57] ABSTRACT

A voltage follower circuit includes a differential amplifier which has first and second transistors. The output of the collector of the second transistor is fed to the base of the second transistor as a feedback input through a third transistor and a diode. The diode operates as a direct current level-shift circuit. A video signal is fed to the base of the first transistor, and the output of the voltage follower circuit is taken from the base of the second transistor.

6 Claims, 2 Drawing Sheets

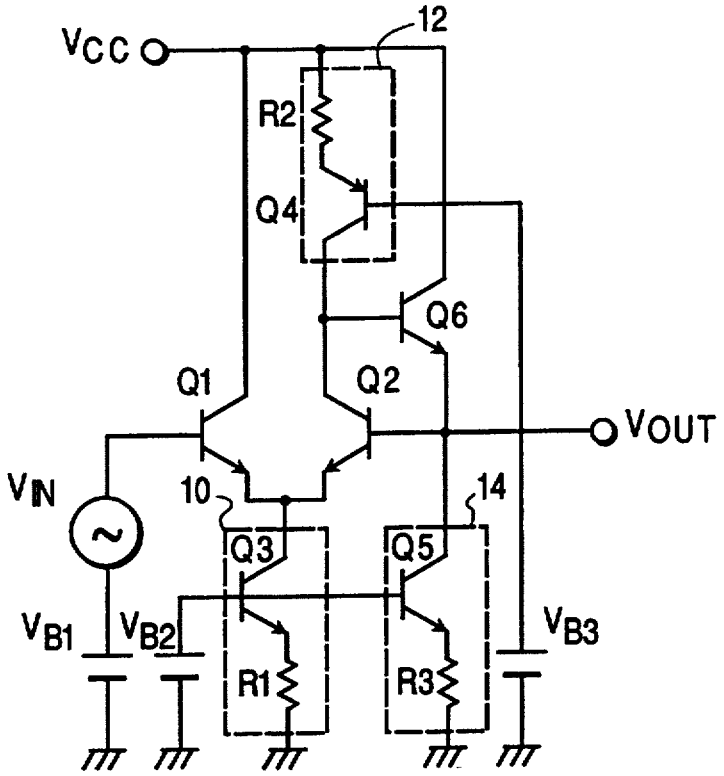
FIG. 1
(RELATED ART)
FIG. 2(A)
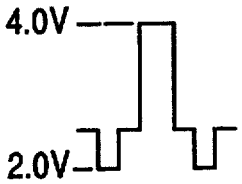
FIG. 2(B)
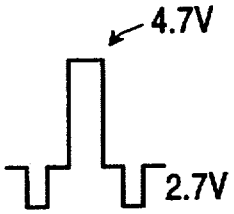
FIG. 4(A)
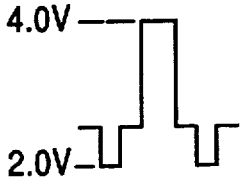
FIG. 4(B)
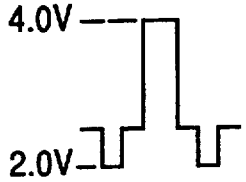

VOLTAGE FOLLOWER CIRCUIT HAVING IMPROVED DYNAMIC RANGE

Matter enclosed in heavy brackets [ ] appears in the original patent but forms no part of this reissue specification; matter printed in italics indicates the additions made by reissue.

BACKGROUND OF THE INVENTION

1. Technical Field

This invention relates to a voltage follower circuit in a linear integrated circuit adapted for video signal processing and other electrical equipment.

2. Description of the Prior Art

In general, a voltage follower circuit is used as an impedance transfer circuit or a distributor. FIG. 1 shows one example of a voltage follower circuit. In FIG. 1, transistors Q1 and Q2 form a differential amplifier, and the emitters of these transistors are connected to a constant current source 10 which includes a transistor Q3 and a resistor R1. The collector of transistor Q1 is connected to voltage source Vcc. The collector of transistor Q2 is connected to a voltage source Vcc through constant current source 12 which includes transistor Q4 and resistor R2. The base of transistor Q2 is grounded through constant current source 14 which includes transistor Q5 and resistor R3. The base of transistor Q2 is also connected to voltage source Vcc through transistor Q6. The base of transistor Q6 is connected to the collector of transistor Q2. The base of transistor Q1 is connected to voltage source VB1 through input signal source VIN. The bases of transistors Q3 and Q5 are connected to voltage source VB2. The base of transistor Q4 is connected to voltage source VB3.

In the above circuit, the voltage sources Vcc, VB1, VB2 and VB3 equal 5 V, 2.0 V, 0.9 V and 4.1 V, respectively, and VIN is a 2 V peak-to-peak signal. Accordingly, the voltage of an input signal of 100% white level would be 4.0 V, the sum of VIN and VB1 (see FIG. 2A). If the voltage follower circuit operated normally, the output of the base of transistor Q2 would be a video signal of 2.0 V at sync-tip level and 4.0 V at 100% white level. However the voltage at the collector of transistor Q2 is 2.7 V at sync-tip level and 4.7 V at 100% white level (see FIG. 2B showing the output of the base of transistor Q2), because the voltage at the collector of transistor Q2 equals the voltage at the base plus 0.7 V of the base-emitter voltage of transistor Q6. Thus, transistor Q4 saturates and the voltage follower circuit fails to operate normally. In other words, the dynamic range of transistor Q2 is small, so that an input video signal is not output normally.

The clamp voltage of the input signal applied to the base of transistor Q1 may be reduced by about 0.3 V. As a result of the reduction, the dynamic range of transistor Q2 will become greater, but it is still inadequate to prevent the above-described saturation problem from occurring.

SUMMARY OF THE INVENTION

Accordingly, it is an object of the present invention to provide an improved voltage follower circuit which has an adequate dynamic range. In accordance with the present invention, the foregoing object is achieved by providing a voltage follower circuit which comprises a differential amplifier including a first and second transistor whose emitters are connected to each other, a first constant current source connected to the emitters of the first and second transistors and a second constant current source connected to the collector of the second transistor. The base of a third transistor is connected to the collector of the second transistor, and a diode is connected between the emitter of the third transistor and the base of the second transistor. A third constant current source is connected to the emitter of the third transistor and a fourth constant current source is connected to the base of the second transistor.

BRIEF DESCRIPTION OF THE DRAWINGS

A more complete appreciation of the present invention and many of its attendant advantages will be readily obtained by reference to the following detailed description considered in connection with the accompanying drawings, in which:

FIG. 1 provides a circuit diagram of a voltage follower circuit according to the related art.

FIG. 2(a–b) illustrates various wave forms of the voltage follower circuit shown in FIG. 1.

FIG. 4(a–b) illustrates various wave forms of the voltage follower circuit shown in FIG. 3.

DETAILED DESCRIPTION OF THE PREFERRED EMBODIMENTS

Figure 3:
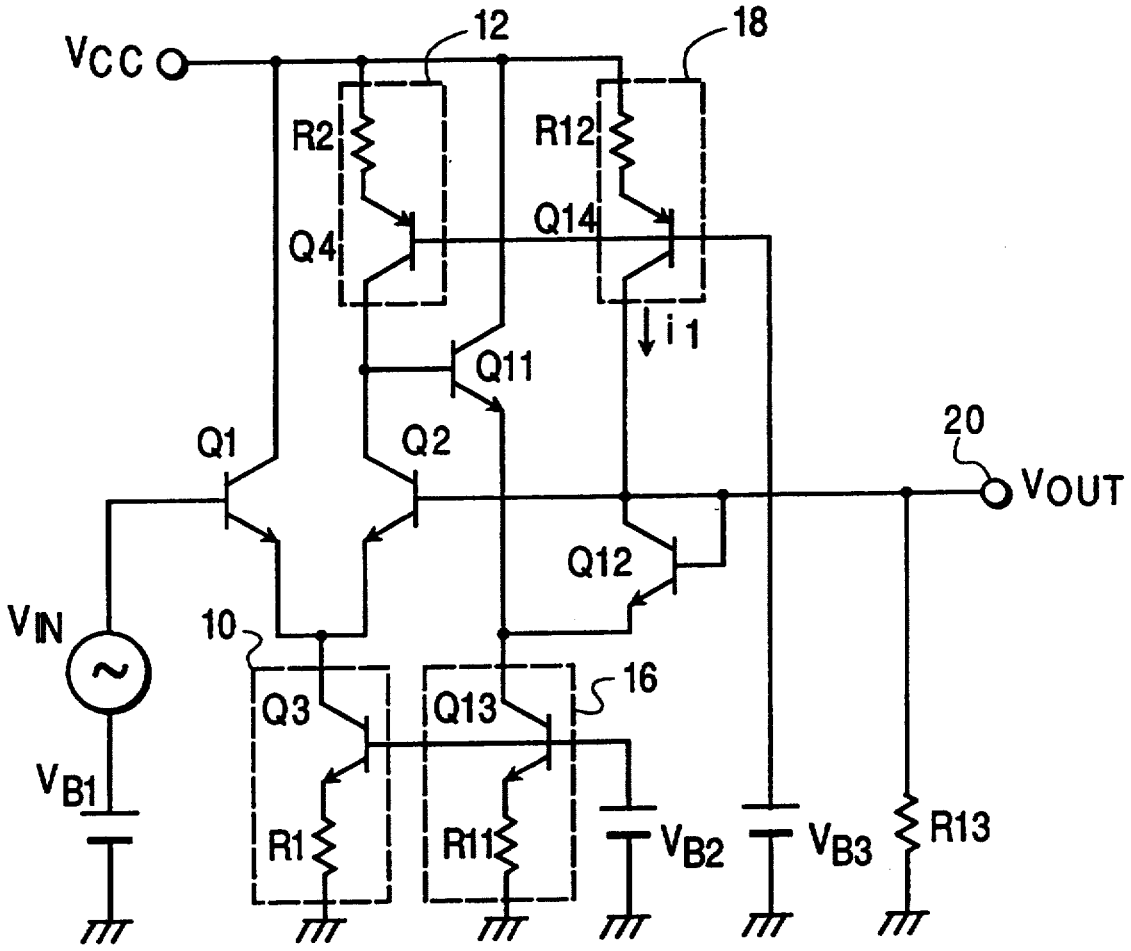
FIG. 3 provides a circuit diagram of a voltage follower circuit according to the present invention.

The preferred embodiment of the present invention will now be described in more detail with reference to the accompanying drawings. Where, in the drawings, the same numerals are applied to similar elements, the detailed descriptions thereof are not repeated.

FIG. 3 is a diagram of a voltage follower circuit of one embodiment of the invention. The emitter of transistor Q11 is connected to the base of transistor Q2 through transistor Q12 which operates as a diode. The emitter of transistor Q11 is also connected to a constant current source 16 including transistor Q13 and resistor R11. The base of transistor Q2 is connected to constant current source 18 including transistor Q14 and resistor R12. The base of transistor Q14 is connected to voltage source VB3. Numeral 20 is an output terminal and resistor R13 is connected between this output terminal 20 and ground.

The operation of the above-described voltage follower circuit is detailed below:

In this circuit, the output of the emitter of transistor Q11 is fed to the base of transistor Q2 through transistor Q12. That is, the voltage from the emitter of transistor Q11 is increased by the level-shifting effect of transistor Q12. When the base of transistor Q1 receives a 2 V peak-to-peak video signal, as shown in FIG. 4A, the voltage at the collector of transistor Q2 is 2.0 V at sync-tip level and 4.0 V at 100% white level of the video signal, as shown in FIG. 4B. Thus, this voltage follower circuit has an adequate dynamic range. Even if the voltage of the voltage source Vcc equals 5 V, this voltage follower circuit operates well with a video signal such as shown in FIG. 4A. If the voltage VBE between the base and the emitter of transistor Q11 is the same as that of transistor Q12, the voltages at the base and the collector of transistor Q2 are always the same, and saturation of transistor Q2 doesn't occur. If resistor R13 is connected to output terminal 20 as a load, as shown in FIG. 3, the following relationship exists, because output terminal 20 is a feedback terminal. wherein 11 is the current of the collector of transistor Q14.

Transistor Q12, which operates as a diode, introduces non-linearity into the output signal from output terminal 20. Nevertheless, linearity of the output signal is not reduced, because output terminal 20 is a feedback terminal.

In the past, video signals were limited to an amplitude of 1 V, because of the limitation of the dynamic range of voltage follower circuits. According to this embodiment, the video signal may have an amplitude of 2 V. Thus, the output video signal doesn't need to be amplified at the input stage of a subsequent circuit which needs a 2 V peak-to-peak input signal, and which is connected to output terminal 20 of the voltage follower circuit.

In this embodiment, each constant current source has a resistor and a transistor. However, only a resistor may be used for the first and the second constant current sources.

We claim:

1. A voltage follower circuit comprising:

a differential amplifier including a first and a second transistor whose emitters are connected to each other, a first constant current source connected to said emitters and a second constant current source connected to the collector of said second transistor, a third transistor, having a base connected to the collector of said second transistor, the first and third transistors having collectors connected to a reference voltage.

a diode connected between the emitter of said third transistor and the base of said second transistor, a third constant current source connected to the emitter of said third transistor, and a fourth constant current source connected to the base of said second transistor wherein the base of said first transistor receives an input signal and wherein the base of said second transistor is an output terminal.

2. A voltage follower circuit as claimed in claim 1, further comprising a load resistor connected to said output terminal.

3. A voltage follower circuit as claimed in claim 1, wherein each constant current source comprises a resistor and a transistor connected serially to said resistor.

4. A voltage follower circuit as claimed in claim 1, wherein each of said first and second constant current sources comprises a resistor, and each of said third and fourth constant current sources comprises a resistor and a transistor connected serially to said resistor.

5. A voltage follower circuit as claimed in claim 1, wherein said diode is a transistor whose base and collector are connected to the base of said second transistor, and whose emitter is connected to the emitter of said third transistor.

6. A voltage follower circuit comprising:

a differential amplifier including a first and a second transistor whose emitters are connected to each other, a first constant current source connected to said emitters and a second constant current source connected to the collector of said second transistor, a third transistor, having a base connected to the collector of said second transistor, the first and third transistor having collectors connected to a reference voltage, a voltage level-shifting connected between the emitter of said third transistor and the base of said second transistor, and a third constant current source connected to the emitter of said third transistor, a fourth constant current source connected to the base of said second transistor wherein the base of said first transistor receives an input signal and wherein the base of said second transistor is an output terminal.

* * * * *